United States Patent [19]

Haitz

[11] Patent Number: 5,087,949
[45] Date of Patent: Feb. 11, 1992

[54] LIGHT-EMITTING DIODE WITH DIAGONAL FACES

[75] Inventor: Roland H. Haitz, Portola Valley, Calif.

[73] Assignee: Hewlett-Packard Company, Palo Alto, Calif.

[21] Appl. No.: 666,467

[22] Filed: Mar. 5, 1991

Related U.S. Application Data

[63] Continuation of Ser. No. 582,803, Sep. 13, 1990, abandoned, which is a continuation of Ser. No. 372,275, Jun. 27, 1989, abandoned.

[51] Int. Cl.$^5$ .............. H01L 33/00; H01L 9/31; H01L 23/48; H01L 29/44
[52] U.S. Cl. .................. 357/17; 357/60; 357/68; 357/55; 357/65
[58] Field of Search .............. 357/17, 55, 68, 60, 357/30, 65

[56] References Cited

U.S. PATENT DOCUMENTS

| | | | |
|---|---|---|---|
| 3,739,217 | 6/1973 | Bergh et al. | 313/108 |
| 3,900,863 | 8/1975 | Kim | 357/17 |
| 3,997,907 | 12/1976 | Nakamura | 357/17 |
| 4,080,245 | 3/1978 | Yamanaka | 357/17 |
| 4,217,689 | 8/1980 | Fujii et al. | 29/583 |
| 4,234,792 | 11/1980 | Delou et al. | 250/361 R |
| 4,856,014 | 8/1989 | Figueroa et al. | 372/46 |
| 4,864,371 | 9/1989 | Steranka | 357/17 |

FOREIGN PATENT DOCUMENTS

| | | | |
|---|---|---|---|
| 2421590 | 11/1975 | Fed. Rep. of Germany | 357/30 |
| 52-058492 | 5/1977 | Japan | 357/55 |
| 0058878 | 4/1984 | Japan | 357/17 |
| 0128576 | 6/1987 | Japan | 357/17 |
| 0244890 | 10/1988 | Japan | 357/17 |

OTHER PUBLICATIONS

IEEE Transactions on Electron Devices, ED-24, No. 7, Jul. 1977; "A GaP Monolithic Numeric Display with Internal Reflection Facets"; pp. 979-982.
Patent Abstracts of Japan, vol. 7, NO. 123 (E-178) (1268) 27 May 1983 & JP-A-58 040872 (Nippon Denki K.K.) 09 Mar. 1983.

Primary Examiner—Andrew J. James
Assistant Examiner—Stephen D. Meier

[57] ABSTRACT

A transparent light-emitting diode has front and back parallel faces and a plurality of side faces perpendicular to the back face. Diagonal faces interconnect each side face with the front face to form a truncated polygonal pyramid surmounting a polygonal base of the light-emitting diode. Because some of the light impinges on the diagonal faces at an angle less than the critical angle for total internal reflection, from 1.5 to 2 times as much light is extracted from the LED as a conventional rectangular LED without the diagonal faces. The diagonal faces on the LEDs are readily made by sawing V-shaped grooves in the front face of a wafer on which the LEDs are fabricated.

17 Claims, 3 Drawing Sheets

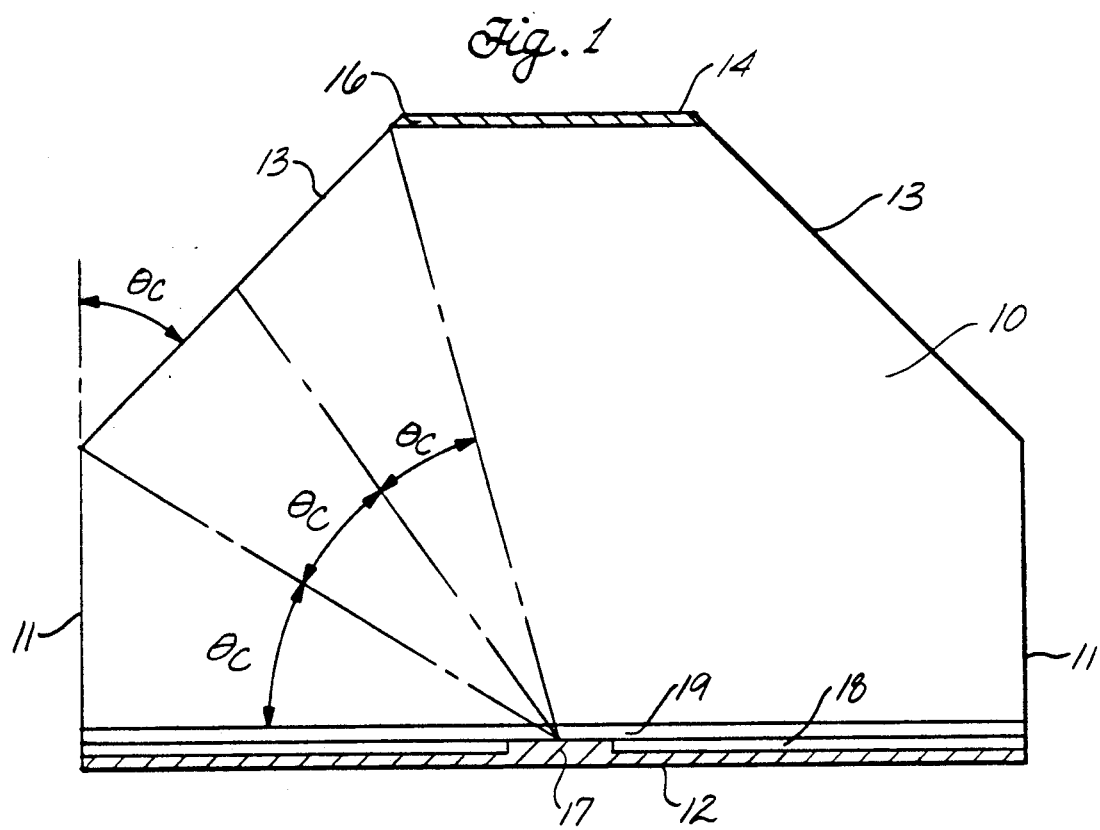
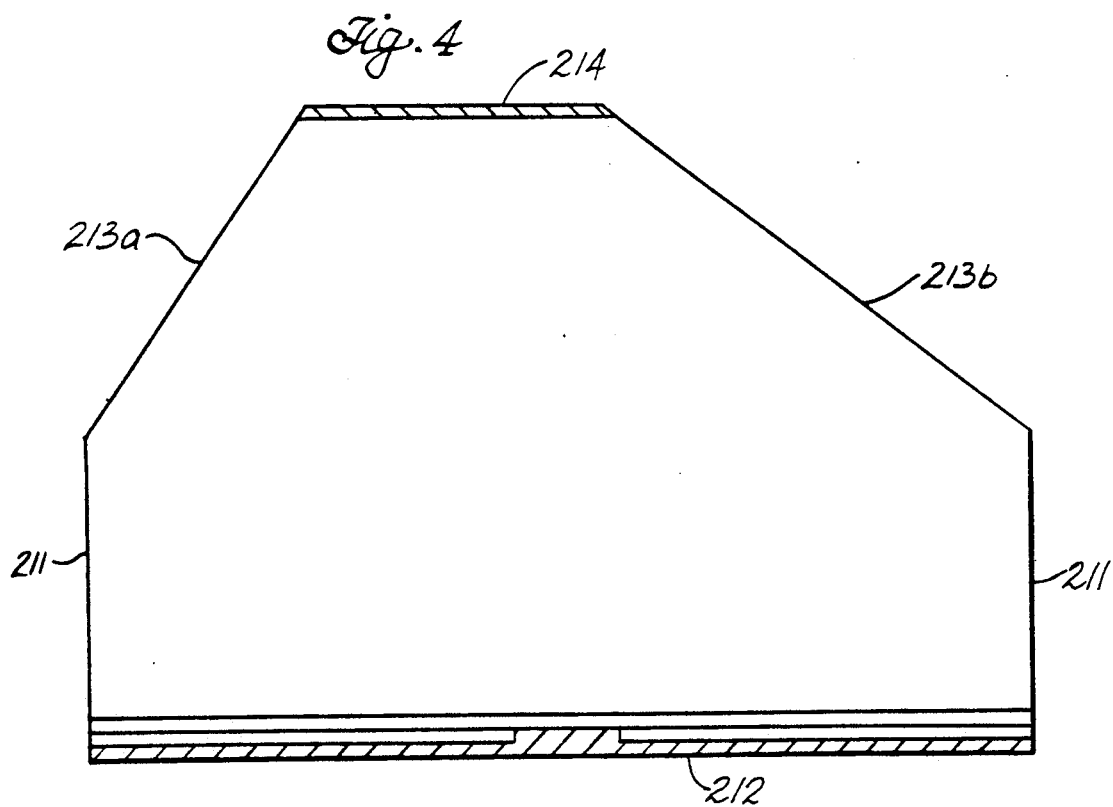

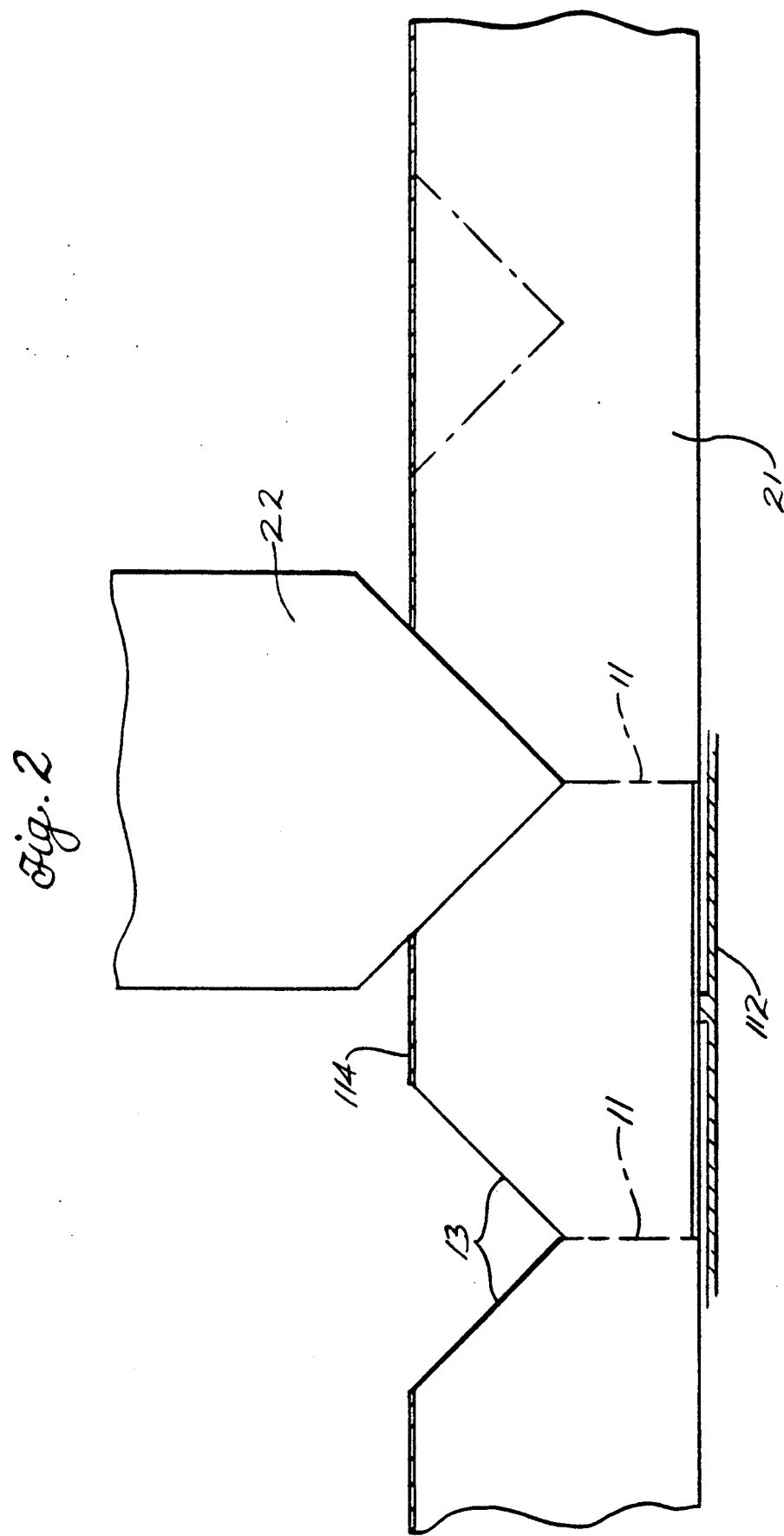

LIGHT-EMITTING DIODE WITH DIAGONAL FACES

This application is a continuation of Ser. No. 582,803, filed Sept. 13, 1990, which is a continuation of Ser. No. 372,275, filed June 27, 1989, which are both now abandoned.

FIELD OF THE INVENTION

This invention relates to a transparent light-emitting diode with light output up to twice the light output of a conventional light-emitting diode.

BACKGROUND OF THE INVENTION

In recent years the light-emitting diode (LED) has become a commonplace device for a broad range of applications. In the visible range it may provide communication between an electronic device and the user. In the infrared range it may have broad applications for communications. It may be used in an optical isolator for decoupling an input signal from an output. In many applications it is an important desideratum that the LED emits a large amount of light for a given current.

Transparent LEDs emit light at a p-n junction within the body of semiconductor forming the LED. Light is emitted in all directions from the junction and because of the transparency of the device, light may be emitted from its four sides and its front surface. The back surface is opaque, but some light may be reflected from it and emitted through the sides or front. A portion of the front surface may be occulted by the need for an electrical contact. Thus, light may be emitted from four sides and a portion of the front.

Extracting light from an LED is not easy because of the high index of refraction of the semiconductor material which may be in the range of from about 2.9 to 4.0, depending on wavelength and material. According to Snell's law $$\sin\theta_c = n_s/n_p$$

only rays that impinge on the chip surface at an angle equal to or less than $\theta_c$ will be refracted through the surface. All rays impinging at angles greater than $\theta_c$ will experience total internal reflection. In other words, only light emitted from a point source within the chip within a cone of total cone angle $2\theta_c$ having its axis perpendicular to the face of the semiconductor chip will escape from the LED.

Assuming that the index of refraction, $n_c$, for the semiconductor is 3.3 and the index of refraction, $n_p$, for a transparent plastic surrounding the semiconductor is 1.5, the critical angle for total internal reflection, $\theta_c$, is 27°. Assuming that the point source of light is isotropic, we find that a fraction, f, of the light flux is within such a cone where f is given by $$f = \frac{1}{2}(1 - \cos\theta_c)\left[1 - \left(\frac{n_c - n_p}{n_c + n_p}\right)^2\right]$$

where the term within the brackets is the correction for Fresnel reflection losses. Where $n_c$ equals 3.3 and $n_p$ equals 1.5, the escape cone contains about 5.2% of the light emitted by the isotropic point source.

LED chips are usually made by a scribe and break technique, resulting in a rectangular parallelepiped where the side faces are smooth crystallographic planes intersecting the front and back surfaces.

An LED chip has six orthogonal surfaces and therefore six possible escape cones. In such a rectangular body reflected rays never change their angle of incidence. In other words, rays emitted in a direction outside of the six escape cones will always remain outside of the escape cones no matter how many reflections they experience. Such rays keep bouncing around within the LED until they eventually are absorbed.

Four of the escape cones directed at the side surfaces are unobstructed. The cone directed towards the back contact surface is partly absorbed and partly reflected towards the front. The cone directed towards the front is partly transmitted through the front and partly occulted and absorbed by the front electrical contact. As a result, in a typical transparent LED light is extracted through only about five cones or approximately 25% of the light generated by the LED is actually emitted.

When the LED is operating in air instead of in transparent plastic, emission is even poorer since the critical angle for total internal reflection is only about 16° to 18°. For this reason it is customary to operate LEDs embedded in transparent plastic for maximum light extraction efficiency.

By making the chip an imperfect rectangular body, for example by sawing the chip instead of cleaving it, somewhat roughened side faces may be obtained. Light is scattered from such roughened surfaces from non-escape directions into the escape cones. Some light within the escape cones may be internally reflected from a roughened surface. Further, the randomizing of the light directions requires many reflections and because of the non-negligible level of absorption, the long light path within the LED results in only a modest increase in extraction efficiency.

Taken to its ultimate or optimal configuration for light extraction, a LED would have a surface of a hemisphere so that light from a small p-n junction in its center is normal to the surface regardless of the ray direction. Such hemispherical LEDs have been built and are highly efficient, but extremely high in price because of the complex processing required. Some of such prior hemispherical LEDs were made by temporarily connecting two LEDs together base-to-base, then tumbling them in a rotating polishing mill until spherical. Alternatively, some of the prior hemispherical LEDs were made by attaching the LED chip to a dop and polishing much as one would polish a lens. The cost of LEDs made by such techniques is prohibitive for most applications.

It is, therefore, desirable to provide means for improving the efficiency of light extraction from an LED. It is also desirable that the technique be one easily implemented in manufacturing operations for LEDs without significantly decreasing the yield of LED chips from a wafer of semiconductor.

BRIEF SUMMARY OF THE INVENTION

There is, therefore, provided in practice of this invention according to a presently preferred embodiment a transparent light-emitting diode formed of a body of semiconductor material having a flat back face. A plurality of side faces extend perpendicular to the back face. These are surmounted by a plurality of diagonal faces with the number of diagonal faces being the same as the number of side faces. The resulting pyramid is truncated by a front face parallel to the back face. Electrical contacted are made with the back and front faces and a p-n junction within the semiconductor body emits light.

Such an LED may have essentially twelve escape cones, and internal reflections of light which does not escape in the first pass has a reasonable probability of being reflected into an escape cone. This provides an improvement in extraction efficiency of up to twice the light from a conventional LED.

BRIEF DESCRIPTION OF THE DRAWINGS

These and other features and advantages of the present invention will be appreciated as the same becomes better understood by reference to the following detailed description of a presently preferred embodiment wherein:

FIG. 1 is an exemplary transverse cross section of a light-emitting diode constructed according to principles of this invention;

FIG. 2 illustrates in transverse cross section a technique for cutting a semiconductor wafer for forming a plurality of light-emitting diodes;

FIG. 4 illustrates in transverse cross section another embodiment of light-emitting diode.

DETAILED DESCRIPTION

Figure 3:
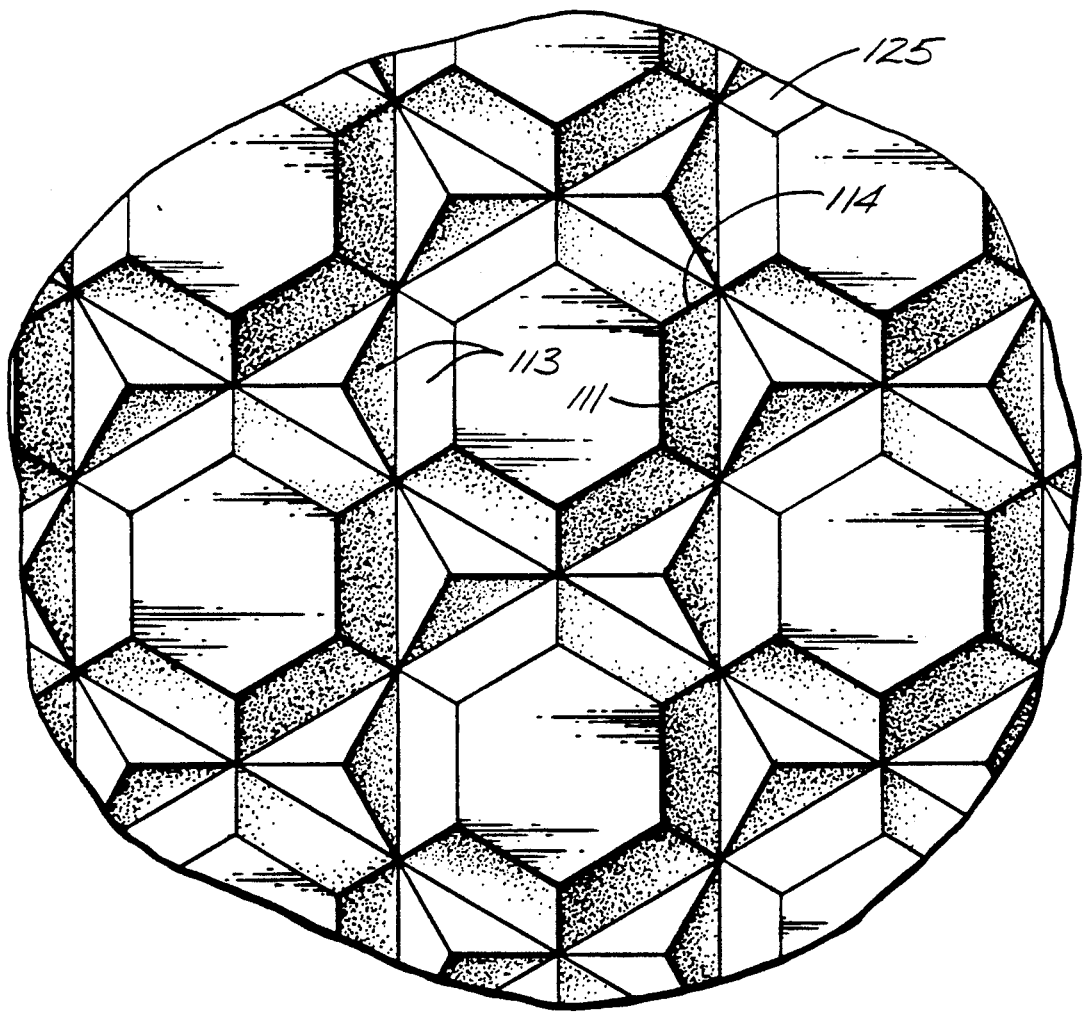
FIG. 3 is a fragmentary plan view of one face of a wafer from which light emitting diodes are cut.

A light-emitting diode (LED) is in the form of a body 10 of semiconductor material such as gallium arsenide, gallium phosphide, $GaAs_{1-y}P_y$ or the like. In practice of this invention the LED has a rectangular base with four side faces 11 perpendicular to the back face 12 of the LED. In a typical embodiment the base is square. The base is surmounted by a truncated rectangular pyramid having four diagonal faces 13 and a front face 14 parallel to the back face. A portion of the front face has a layer of metal 16 such as a gold germanium alloy for making electrical contact to the LED.

Electrical contact is made to the bottom of the LED by way of a metal layer 17 such as a gold beryllium alloy. Most of the back contact 17 is insulated from the body of semiconductor by an intervening dielectric silica layer 18. The back metal layer makes electrical contact through an aperture in the silica layer to a layer 19 of p-type material in the body of semiconductor which is primarily n-type material. Light is emitted from the resulting p-n junction and is transmitted through the semiconductor material which is transparent to the emitted wave length.

For purposes of description of the improved extraction efficiency, it is assumed that light is emitted isotropically from a point source in the center of the p-n junction. If each side face subtends an angle from the center of the junction equal to $\theta_c$, a half cone of light will escape through the side face (light at an angle greater than $\theta_c$ is internally reflected). The other half of the cone, that is, light emitted towards the back surface, is reflected upward by the dielectric/metal mirror and arrives at the side face at an angle depending on its original direction. In other words, light from the lower half cone with a cone angle of $\theta_c$ is transmitted through the side face, resulting in a light flux equivalent to a full cone.

It is preferred that each diagonal face of the truncated pyramid is tilted relative to the side face of the base at an angle in the order of twice the critical angle for total internal reflection, $\theta_c$. Further, the width of the diagonal face from the side face to the front face subtends an angle from the center of the p-n junction in the order of twice the critical angle for total internal reflection. Light within a $2\theta_c$ cone from the assumed point source in the center of the junction will pass through the diagonal face.

Since light emitted toward the back face reflector is reflected forwardly towards the diagonal face, there is a second escape cone through that diagonal face. In other words, there are three escape cones of light transmitted through the two surfaces 11 and 13 on each of the four sides of the rectangular body. Thus there are essentially 12 escape cones which are not significantly affected by metal or contact obstructions.

Light transmitted towards the front contact directly, or indirectly by reflection from the back face, is at least partly occulted by the opaque electrical contact; hence, there is something less than two full cone equivalents emitted through the front face of the LED.

Thus, there are twelve escape cones containing about 62% of the emitted light and two cones centered on the front and back faces containing about 10% of the light that is absorbed. The remaining 28% of the light emitted has a reasonable probability of being reflected into one of the twelve escape cones after one or two reflections on the surfaces of the LED. This probability is enhanced when the diagonal faces are non-specular due to slight roughening during the process of manufacture and there is some scattering of light from the roughened surface. If only one-third of the 28% of light that is outside the escape cones is extracted, the extraction efficiency of the LED is about 70% as compared with about 26% for a conventional rectangular LED. Thus there is a potential improvement in LED efficiency of about 2.7 times.

This efficiency has not been achieved in practice yet. Not all of the light is emitted from the center of the p-n junction. The light emitting area is essentially the entire area of the p-n junction, which typically covers a large fraction of the LED cross section to avoid degradation of the LED at high current densities.

Further, the center of the p-n junction is over the aperture in the silica layer where electrical contact is made. Light emitted toward the back contact is almost entirely absorbed. Although light emitted from areas of the p-n junction above the back contact are absorbed, that contact makes up only about 5% of the p-n junction area.

With an extended light source, the light output of an LED with diagonal faces is in the order of twice the light output of a conventional LED. Such doubling of the extraction efficiency can be highly significant.

Although the inclination of the diagonal face and the angles subtended by the faces are in the same order as the critical angle for total internal reflection, variations from such dimensions are appropriate as the area of the p-n junction increases. It turns out that with a p-n junction that extends all the way across the back face of the LED, an angle between the diagonal face and the side face in the range of from 30° to 60° is appropriate, with good results being obtained with an angle of 45°.

Thus, in an exemplary embodiment an LED may be 300 micrometers square and have a total height of 200 micrometers. The height of the side faces is 100 micrometers and the diagonal faces extend at an angle of 45° relative to the side faces. Tests of light-emitting diodes with diagonal faces in the range of from 30° to 60° from the side faces show improvements in light extraction efficiency of from one and one-half to two times the light output of a conventional LED of similar dimensions without the diagonal faces.

Fabrication of a LED with beveled edges is a straightforward adaption of conventional manufacturing techniques for semiconductors. LEDs are conventionally made in substantial numbers on a wafer of semiconductor. Very light scratches may be scribed on a face of the semiconductor to provide a crack initiator. When broken, the individual LEDs are cleaved from each other along crystallographic planes extending from the scribe lines. Alternatively, the LEDs are sawed from the wafer with a diamond dicing saw.

To make a beveled LED, an array of parallel V-shaped grooves are sawed into one face of a wafer 21 by a nearly conventional diamond dicing saw 22. The dicing saw perimeter is dressed with a V-shaped face to produce diagonal faces 13 on adjacent LEDs to be separated from the wafer. The depth of the saw cut is controlled to define the desired width of the diagonal faces.

After sawing arrays of parallel V-shaped grooves in orthogonal directions, the individual LEDs may be separated from each other by cleaving from the bottom of the groove, or a second pass may be made with a conventional dicing saw aligned with the bottom of the groove to cut the balance of the distance through the wafer. In still another alternative the face of the dicing saw may be dressed so that the V-shaped groove and the parallel-sided cut through the balance of the wafer are made in a single pass of the dicing saw. After sawing, the sawed surfaces are etched for removing the highly absorbing saw damaged material adjacent to the surface.

It will be noted that cleaving produces side faces 11 of the LEDs which are substantially specular. The diagonal faces are slightly roughened due to the diamond particles in the dicing saw. The side faces are also slightly roughened when the LEDs are separated from each other by sawing. The resultant non-specular reflection of light from such faces slightly enhances efficiency of light extraction from the LED.

Taken to its ultimate or optimal configuration for light extraction, a LED would have a surface of a hemisphere so that light from the center of the p-n junction is normal to the surface regardless of the ray direction and light from other areas of the p-n junction either exits on the first pass or after a limited number of reflections. This is not a feasible geometry for semiconductor manufacturing techniques. The square LED with beveled edges hereinabove described is a better approximation of a hemisphere than the rectangular parallelopipid of a conventional LED.

A still better approximation of a hemispherical external shape is provided by a sawing pattern as illustrated in FIG. 3 which is a plan view of a fragment of a wafer with an array of V-shaped grooves cut in the front surface for separating individual LEDs from each other. As illustrated in this embodiment, each LED has a hexagonal front face 114 and six diagonal faces 113 adjacent six side faces 111 of the LED. The diagonal faces on the several LEDs on the wafer are defined by sawing a plurality of V-shaped grooves 125 at 60° from each other in the front face of the wafer.

The individual LEDs may then be separated from each other by cleaving from the bottom of the grooves or by extending a dicing saw cut clear through the wafer as hereinabove described. The latter technique is preferred since the crystal structure of the semiconductor does not lend itself to crystallographic cleavage at 60° angles and there is no problem in removing the triangular scraps between adjacent LEDs. It will be noted that because of such scraps the yield of hexagonal LEDs from a wafer is two-thirds of the yield of rectangular LEDs. The enhanced light extraction efficiency through twelve faces as compared with eight faces in the rectangular embodiment may offset the added cost due to decreased yield.

FIG. 4 illustrates in transverse cross section another embodiment of LED for high efficiency light extraction. This LED has side faces 211 and a back face 212 similar to the embodiments hereinabove described. It differs, however, in that one of the diagonal faces 213a is at a different angle from its adjacent side face 211 than the angle between the opposite side face 213b and its adjacent side face. A similar asymmetry is provided for the other two diagonal faces not illustrated in the drawing. As a result of this asymmetry, the front face 214 is shifted diagonally toward one corner of the LED.

The angular difference between the opposite faces is only a few degrees so that there is little degradation of the light extraction efficiency due to an exit cone of light illuminating an area off of a diagonal face. Substantial degradation may be avoided by choice of dimensions of the side faces and diagonal faces. However, extraction efficiency of light internally reflected within the LED is enhanced due to the asymmetrical reflections from the diagonal faces.

Such an embodiment with asymmetrical beveling is easily made by the technique described hereinabove by simply dressing the face of the dicing saw with the desired asymmetry, thereby producing an asymmetrical V-shaped groove.

Although limited embodiments of light-emitting diode constructed according to principles of this invention have been described and illustrated herein, many modifications and variations will be apparent to those skilled in the art. Thus, for example, in the illustrated embodiments the p-n junctions is quite near the back face of the LED. It may be desirable to employ a LED where the p-n junction is an appreciable distance above the back face. In such an embodiment it is preferable that the height of the side faces should subtend an angle above the center of the junction in the order of the critical angle for total internal reflection. Thus, half of the light in the exit cone is above the plane of the junction and some of the light may exit the side face below the plane of the p-n junction.

It will also be apparent that other polygonal shapes such as triangular or octagonal LEDs may be provided in practice of this invention. It is, therefore, to be understood that within the scope of the appended claims the invention may be practiced otherwise than as specifically described.

What is claimed is:

1. A transparent light-emitting diode comprising:
   an opaque back face at a back of the light-emitting diode;
   a front electrical contact at the front of the light-emitting diode; and
   a body of transparent semiconductor between the back and the front electrical contact having a back p-n junction substantially parallel and adjacent to the back face and remote from the front electrical contact, the body being in the form of a polygonal base adjacent to the back and having side faces perpendicular to the back p-n junction, the body also being surmounted by a truncated polygonal pyramid through the side faces of which light is emitted from the light-emitting diode, each face of the pyramid intersecting a face of the base along a line, the front electrical contact being in the truncated end of the pyramid.

2. A light-emitting diode as recited in claim 1 wherein the base is rectangular with side faces perpendicular to the back junction, and the pyramid is a rectangular pyramid.

3. A light-emitting diode as recited in claim 1 wherein the angle between a face of the pyramid and an intersecting side face of the base is in the order of twice the critical angle for total internal reflection.

4. A light-emitting diode as recited in claim 1 wherein the angle between a face of the pyramid and an intersecting side face of the base is in the range of from 120° to 150°.

5. A light-emitting diode as recited in claim 1 wherein the width of each face of the pyramid measured from its intersection with a side face of the base to its intersection with the front of the light-emitting diode subtends and angle from the center of the back junction in the order of twice the critical angle for total internal reflection.

6. A light-emitting diode as recited in claim 1 wherein the height of a side face of the base above the junction subtends an angle from the center of the junction in the order of the critical angle for total internal reflection.

7. A light-emitting diode as recited in claim 1 wherein the pyramid is asymmetrical.

8. A light-emitting diode as recited in claim 1 wherein the angle between a side face of the base and an intersecting face of the pyramid on one side of the light-emitting diode is different from the angle between a side face of the base and an intersecting face of the pyramid on the opposite side of the light-emitting diode.

9. A light-emitting diode as recited in claim 1 wherein the back face of the light-emitting diode is at least partly reflective.

10. A transparent light-emitting diode comprising:
a body of semiconductor material having;
a back face,
a front face parallel to the back face,
a plurality of side faces extending away from and perpendicular to the back face,
a plurality of diagonal faces interconnecting the side faces and the front face, the number of diagonal faces being the same as the number of side faces;
means for making electrical contact with the front face;
means for making electrical contact with the back face; and
a p-n junction within a portion of the body having side faces between the back face and the intersection of the diagonal faces and the side faces for emitting light.

11. A light-emitting diode as recited in claim 10 wherein the side faces are at right angles to each other and the diagonal faces define a truncated rectangular pyramid.

12. A light-emitting diode as recited in claim 10 wherein the angle between a diagonal face and a side face is in the order of twice the critical angle for total internal reflection.

13. A light-emitting diode as recited in claim 10 wherein the angle between a diagonal face and an intersecting side face is in the range of from 120° to 150°.

14. A light-emitting diode as recited in claim 10 wherein the width of each diagonal face measured from its intersection with a side face to its intersection with the front face subtends an angle from the center of the p-n junction in the order of twice the critical angle for total internal reflection.

15. A light-emitting diode as recited in claim 10 wherein the height of each side face measured from the back face subtends an angle from the center of the p-n junction in the order of the critical angle for total internal reflection.

16. A light-emitting diode as recited in claim 10 wherein the angle between a side face of the base and an intersecting diagonal face on one side of the light-emitting diode is different from the angle between a side face and an intersecting diagonal face on the opposite side of the light-emitting diode.

17. A light-emitting diode as recited in claim 10 wehrein the diagonal faces are at appropriate angles relative to the side faces of for transmitting light from the light-emitting diode.

* * * * *